United States Patent
Park

(10) Patent No.: US 11,881,488 B2
(45) Date of Patent: Jan. 23, 2024

(54) DISPLAY PANEL

(71) Applicant: Samsung Display Co., Ltd., Yongin-si (KR)

(72) Inventor: Sun Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 17/352,093

(22) Filed: Jun. 18, 2021

(65) Prior Publication Data

US 2022/0077194 A1 Mar. 10, 2022

(30) Foreign Application Priority Data

Sep. 10, 2020 (KR) .......... 10-2020-0116223

(51) Int. Cl.
| | |
|---|---|
| *H01L 27/14* | (2006.01) |
| *H01L 27/12* | (2006.01) |
| *H01L 25/16* | (2023.01) |
| *H10K 59/131* | (2023.01) |

(52) U.S. Cl.
CPC .......... *H01L 27/124* (2013.01); *H01L 25/167* (2013.01); *H01L 27/1255* (2013.01); *H10K 59/1315* (2023.02)

(58) Field of Classification Search
CPC . H01L 27/124; H01L 25/167; H01L 27/1255; H01L 27/3279; G09F 9/33; G09G 3/3266; G09G 2320/0209; H10K 59/1315

USPC ...................................................... 257/59, 72

See application file for complete search history.

(56) References Cited

U.S. PATENT DOCUMENTS

| | | | |
|---|---|---|---|
| 9,817,284 B2 * | 11/2017 | Morita ............. | G02F 1/134309 |
| 9,915,847 B2 * | 3/2018 | Cho ..................... | H01L 27/124 |
| 10,649,295 B2 * | 5/2020 | Yamazaki ......... | G02F 1/136213 |
| 2014/0027728 A1 * | 1/2014 | Yoon ....................... | H01L 33/08 |
| | | | 438/34 |
| 2017/0162822 A1 * | 6/2017 | Park ..................... | H01L 51/5246 |
| 2022/0320219 A1 * | 10/2022 | Zheng ..................... | H01L 51/56 |

FOREIGN PATENT DOCUMENTS

| | | | |
|---|---|---|---|
| CN | 208062051 U | * | 11/2018 |
| KR | 10-0347065 B1 | | 8/2002 |
| KR | 10-2017-0080861 A | | 7/2017 |
| KR | 10-2076839 B1 | | 2/2020 |
| KR | 10-2118153 B1 | | 6/2020 |

\* cited by examiner

*Primary Examiner* — Tan N Tran
(74) *Attorney, Agent, or Firm* — Lewis Roca Rothgerber Christie LLP

(57) ABSTRACT

A display panel includes: a first gate line extending in a first direction; a second gate line extending in the first direction and spaced apart from the first gate line in a second direction crossing the first direction; a first connection line extending in the second direction; and a second connection line extending in the second direction and spaced apart from the first connection line in the first direction, wherein a distal end of the first connection line overlaps the first gate line and is electrically connected to the first gate line, and wherein a distal end of the second connection line overlaps the second gate line and is electrically connected to the second gate line.

19 Claims, 11 Drawing Sheets

DISPLAY PANEL

CROSS-REFERENCE TO RELATED APPLICATION(S)

The present application claims priority to and the benefit of Korean Patent Application No. 10-2020-0116223, filed on Sep. 10, 2020, which is hereby incorporated by reference for all purposes as if fully set forth herein.

BACKGROUND

1. Field

Aspects of some embodiments of the present inventive concept relate to a display panel.

2. Discussion of the Background

A display device may include a display panel and a panel driver. The display panel may include driving lines including gate lines and data lines. The panel driver may include a gate driver and a data driver. In general, the gate driver may be located at a side of the display panel, and the data driver may be located at another side of the display panel.

In order to implement a display device having a narrow bezel, both the gate driver and the data driver may be located at a side of the display panel. In this case, as the number of driving lines crossing each other on the display panel increases, instances of a contact failure between the driving lines may increase.

The above information disclosed in this Background section is only for enhancement of understanding of the background and therefore the information discussed in this Background section does not necessarily constitute prior art.

SUMMARY

Aspects of some embodiments of the present inventive concept include a display panel with relatively reduced instances of contact failures between driving lines.

Aspects of some embodiments of the present inventive concept may also include a display panel with relatively improved yield.

Additional features and concepts of some embodiments according to the inventive concepts will be set forth in the description which follows, and in part will be apparent from the description, or may be learned by practice of the inventive concepts.

A display panel according to some embodiments may include a first gate line extending in a first direction, a second gate line extending in the first direction and spaced apart from the first gate line in a second direction crossing the first direction, a first connection line extending in the second direction, and a second connection line extending in the second direction and spaced apart from the first connection line in the first direction. A distal end of the first connection line may overlap the first gate line and is electrically connected to the first gate line. A distal end of the second connection line may overlap the second gate line and may be electrically connected to the second gate line.

According to some embodiments, the first connection line may be spaced apart from the second gate line in a plan view.

According to some embodiments, the second connection line may overlap the first gate line in the plan view.

According to some embodiments, a length of the first connection line in the second direction may be less than a length of the second connection line in the second direction.

According to some embodiments, the display panel may further include a first pixel in a first pixel column and a first pixel row, and electrically connected to the first gate line, and a second pixel in the first pixel column and a second pixel row spaced apart from the first pixel row in the second direction, and electrically connected to the second gate line. The first and second connection lines may be adjacent to each other.

According to some embodiments, the display panel may further include a substrate, a first insulating layer on the substrate, an active pattern on the first insulating layer, a second insulating layer covering the active pattern, a gate electrode on the second insulating layer, and a third insulating layer covering the gate electrode. The first gate line may be on the third insulating layer.

According to some embodiments, the first connection line may include a lower metal pattern between the substrate and the first insulating layer, extending in the second direction, and electrically connected to the first gate line.

According to some embodiments, a distal end of the lower metal pattern overlapping the first gate line may contact the first gate line.

According to some embodiments, the first connection line may further include a first upper metal pattern on the lower metal pattern, overlapping the lower metal pattern, and electrically connected to the lower metal pattern.

According to some embodiments, the first connection line may further include a second upper metal pattern on the first upper metal pattern, overlapping the lower metal pattern, and electrically connected to the lower metal pattern.

According to some embodiments, the first upper metal pattern may be in a same layer as the gate electrode. The second upper metal pattern may be in a same layer as the first gate line.

According to some embodiments, the display panel may further include a floating electrode spaced apart from the distal end of the first connection line in the second direction and overlapping the second gate line in a plan view.

According to some embodiments, the floating electrode may not contact the second gate line.

According to some embodiments, the floating electrode may be spaced apart from the second connection line in the plan view.

A display panel according to some embodiments may include a substrate, a lower insulating layer on the substrate, an active pattern on the lower insulating layer, an upper insulating layer covering the active pattern, gate lines on the upper insulating layer, extending in a first direction, and spaced apart from each other in a second direction crossing the first direction, and connection lines between the substrate and the lower insulating layer, extending in the second direction, and spaced apart from each other in the first direction. A first connection line may be electrically connected to a first gate line, and may be spaced apart from a second gate line in a plan view. A second connection line may be electrically connected to the second gate line, and may overlap the first and second gate lines in the plan view.

According to some embodiments, a distal end of the first connection line may overlap the first gate line in the plan view. A distal end of the second connection line may overlap the second gate line in the plan view.

According to some embodiments, the display panel may further include a floating electrode in a same layer as the first connection line, spaced apart from the first connection line, and overlapping the second gate line in the plan view.

According to some embodiments, the floating electrode may not contact the second gate line.

According to some embodiments, the floating electrode may be spaced apart from the second connection line in the plan view.

The display panel according to some embodiments may include the gate driver, the gate lines, and the connection lines. Each of the connection lines may be electrically connected to corresponding one of the gate lines. Each of the connection lines may extend only from the gate driver to the corresponding one of the gate lines. Accordingly, instances of contact failures between lines crossing each other on the display panel may be reduced, and the yield of the display panel and the display device including the same may be improved.

It is to be understood that both the foregoing general description and the following detailed description describe aspects of some example embodiments and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate aspects of some embodiments of the invention, and together with the description serve to explain the inventive concepts.

DETAILED DESCRIPTION

Illustrative, non-limiting embodiments will be more clearly understood from the following detailed description in conjunction with the accompanying drawings.

Figure 1:
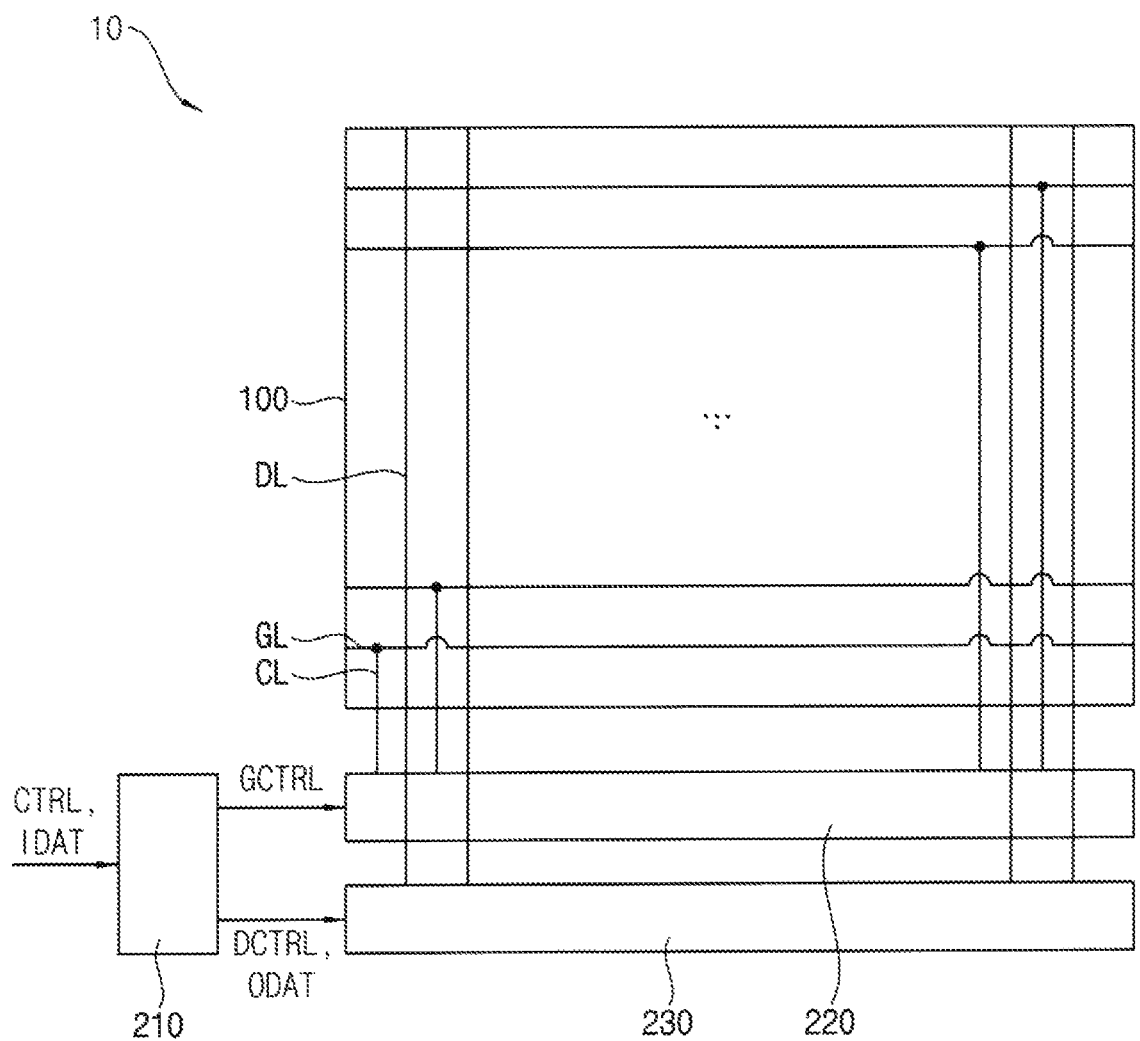
FIG. 1 is a block diagram illustrating a display device according to some embodiments.
Figure 2:
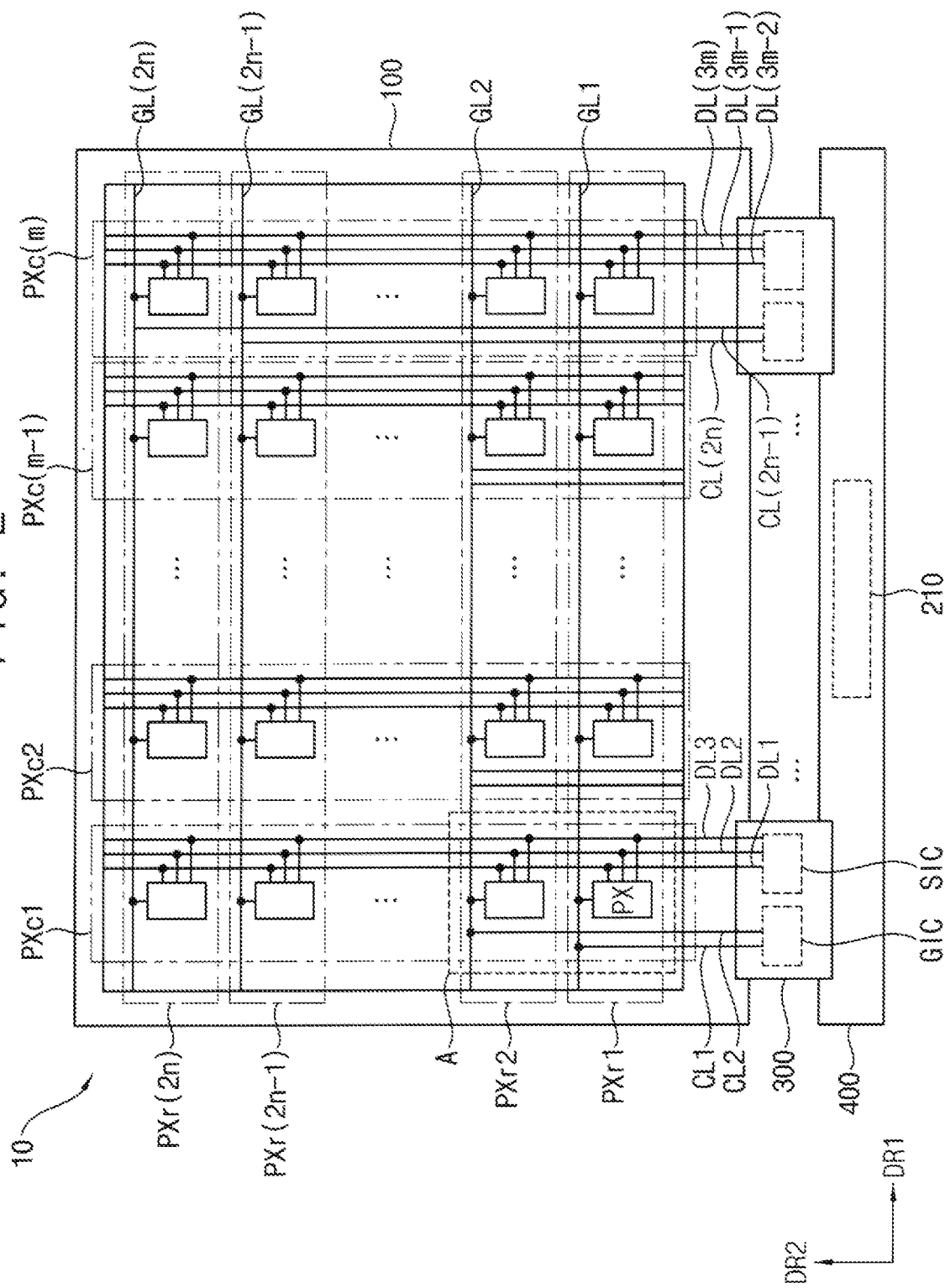
FIG. 2 is a plan view illustrating a display device according to some embodiments.

FIG. 1 is a block diagram illustrating a display device according to some embodiments. FIG. 2 is a plan view illustrating a display device according to some embodiments.

Referring to FIGS. 1 and 2, a display device 10 may include a display panel 100 and a panel driver. The panel driver may include a driving controller 210, a gate driver 220, and a data driver 230.

The display panel 100 may include a display area at which images are displayed and a peripheral area located adjacent to the display area.

The display panel 100 may include a plurality of gate lines GL, a plurality of data lines DL, a plurality of connection lines CL, and a plurality of pixels PX. The pixels PX may be electrically connected to the gate lines GL and the data lines DL. The pixels PX may emit light by receiving signals and/or voltages from the gate lines GL and the data lines DL.

Each of the connection lines CL may cross each of the gate lines GL. The connection lines CL may be electrically connected to corresponding ones of the gate lines GL, respectively.

The driving controller 210 may generate a gate control signal GCTRL, a data control signal DCTRL, and output image data ODAT based on an input image data IDAT and an input control signal CTRL provided from an external device. For example, the input image data IDAT may be RGB data including red image data, green image data, and blue image data. The input control signal CTRL may include a master clock signal and an input data enable signal. The input control signal CTRL may further include a vertical synchronization signal and a horizontal synchronization signal.

The gate driver 220 may generate gate signals based on the gate control signal GCTRL provided from the driving controller 210. For example, the gate control signal GCTRL may include a vertical start signal and a gate clock signal. The gate driver 220 may sequentially output the gate signals to the connection lines CL. The gate lines GL may sequentially receive the gate signals from the gate driver 220 through corresponding ones of the connection lines CL, respectively.

The data driver 230 may generate data voltages based on the data control signal DCTRL and the output image data ODAT provided from the driving controller 210. For example, the data control signal DCTRL may include an output data enable signal, a horizontal start signal, and a load signal. The data driver 230 may output the data voltages to the data lines DL The pixels PX may be arranged in a matrix form. For example, as illustrated in FIG. 2, the display area of the display panel 100 may be divided into a plurality of pixel rows and a plurality of pixel columns. The pixel columns may include first pixel column PXc(1) to (m)th pixel column PXc(m) arranged in a first direction DR1 (where m is an integer of 2 or more). The pixel rows may include first pixel row PXr(1) to (2n)th pixel row PXr(2n) arranged in a second direction DR2 crossing the first direction DR1 (where n is an integer of 1 or more). That is, (2n×m) number of pixels PX may be located in the display panel 100.

According to some embodiments, the display device 10 may further include a flexible circuit board 300 and a printed circuit board 400. For example, as illustrated in FIG. 2, the driving controller 210 may be located on the printed circuit board 400, and the gate driver 220 and the data driver 230 may be located on the flexible circuit board 300. For example, the gate driver 220 may include a plurality of gate driving chips GIC, and the data driver 230 may include a plurality of source driving chips SIC. The gate driving chips GIC and the source driving chips SIC may be located on the flexible circuit board 300.

The flexible circuit board 300 may electrically connect the printed circuit board 400 and the display panel 100. For example, the printed circuit board 400 and the flexible circuit board 300 may be electrically connected to each other by a conductive film such as an anisotropic conductive film (ACF), and the flexible circuit board 300 and the display panel 100 may be electrically connected to each other by another conductive film.

According to some embodiments, both the gate driving chip GIC and the source driving chip DIC may be located on each flexible circuit board 300. In this case, the gate driving chip GIC and the source driving chip DIC may be arranged in a same direction with respect to the display panel 100. For example, as illustrated in FIG. 2, the gate driving chip GIC and the source driving chip DIC may be located in the peripheral area adjacent to a lower side of the display panel 100. In other words, the gate driver 220 and the data driver 230 may not be located in the peripheral area adjacent to a left or right side of the display panel 100. Accordingly, a bezel on the left or right side of the display device 10 may be reduced.

According to some embodiments, the gate driver 220 and/or the data driver 230 may be mounted on the display panel 100 or integrated in the display panel 100.

Each of the pixels PX may include at least one sub-pixel. For example, each of the pixels PX may include a first sub-pixel emitting red light, a second sub-pixel emitting green light, and a third sub-pixel emitting blue light.

According to some embodiments, each of the connection lines CL may extend in the second direction DR2. The connection lines CL may be spaced apart from each other along the first direction DR1. For example, each of the connection lines CL may have a stripe shape overall in a plan view. For example, each of the connection lines CL may be stripe shaped (e.g., extending as a solid straight line) as a whole on the display area of the display panel 100.

The connection lines CL may electrically connect the gate driver 220 and the corresponding ones of the gate lines GL, respectively. For example, a first connection line CL1 may electrically connect the gate driver 220 and a first gate line GL1, a second connection line CL2 may electrically connect the gate driver 220 and a second gate line GL2, a (2n−1)th connection line CL(2n−1) may electrically connect the gate driver 220 and a (2n−1)th gate line GL(2n−1), and a (2n)th connection line CL(2n) may electrically connect the gate driver 220 and a (2n)th gate line GL(2n).

For example, an end of each of the connection lines CL may be connected to a corresponding one of the gate lines GL. The end may be a distal end of each of the connection lines CL in the second direction DR2. Another end of each of the connection lines CL may be connected to the gate driving chip GIC. For example, the other end of each of the connection lines CL may be connected to the gate driving chip GIC through a fan-out line. The other end may be another distal end of each of the connection lines CL in a direction opposite to the second direction DR2.

According to some embodiments, as the end of each of the connection lines CL is connected to the corresponding one of the gate lines GL, the lengths of the connection lines CL in the second direction DR2 may be different from each other, as illustrated in FIG. 2. For example, a length of the first connection line CL1 in the second direction DR2 may be less than a length of the second connection line CL2 in the second direction DR2.

According to some embodiments, a plurality of connection lines CL may be arranged to correspond to a pixel column. In other words, the plurality of connection lines CL may be located between two pixel columns adjacent to each other. For example, the plurality of connection lines CL arranged to correspond to a pixel column may be adjacent to each other.

For example, as illustrated in FIG. 2, the first and second connection lines CL1 and CL2 may be arranged to correspond to the first pixel column PXc(1), and the (2n−1)th and (2n)th connection lines CL(2n−1) and CL(2n) may be arranged to correspond to the (m)th pixel column PXc(m). That is, the (2n−1)th and (2n)th connection lines may be located adjacent to each other between pixels PX located in a (m−1)th pixel column PXc(m−1) and pixels PX located in the (m)th pixel column PXc(m). However, the number of connection lines CL arranged to correspond to a pixel column is not limited thereto.

According to some embodiments, a connection line CL may be arranged to correspond to a pixel column. That is, a connection line CL may be located between two pixel columns adjacent to each other. In other words, the connection lines CL and the pixels PX may be alternately arranged in the first direction DR1.

According to some embodiments, each of the gate lines GL may extend in the first direction DR1. The gate lines GL may be spaced apart from each other in the second direction DR2. For example, a gate line GL may be arranged to correspond to a pixel row. That is, a gate line GL may be located between two pixel rows adjacent to each other. In other words, the gate lines GL and the pixels PX may be alternately arranged in the second direction DR2.

Each of the gate lines GL may electrically connect the pixels PX arranged in a corresponding one of the pixel rows and a corresponding one of the connection lines CL. For example, the first gate line GL1 may electrically connect pixels PX located in the first pixel row PXr(1) and the first connection line CL1, the second gate line GL2 may electrically connect pixels PX located in a second pixel row PXr(2) and the second connection line CL2, the (2n−1)th gate line GL(2n−1) may electrically connect pixels PX located in a (2n−1)th pixel row PXr(2n−1) and the (2n−1)th connection line CL(2n−1), and the (2n)th gate line GL(2n) may electrically connect pixels PX located in the (2n)th pixel row PXr(2n) and the (2n)th connection line CL(2n).

According to some embodiments, each of the data lines DL may extend in the second direction DR2. The data lines DL may be spaced apart from each other in the first direction DR1. For example, first to third data lines DL1, DL2, and DL3 may be arranged to correspond to the first pixel column PXc(1), and (3m−2)th to (3m)th data lines DL(3m−2), DL(3m−1), and DL(3m) may be arranged to correspond to the (m)th pixel column PXc(m). That is, three data lines DL may be arranged to correspond to a pixel column. In other words, three data lines DL may be located between two pixel columns adjacent to each other. However, the number of data lines DL arranged to correspond to a pixel column is not limited thereto.

Each of the data lines DL may electrically connect the pixels PX located in a corresponding one of the pixel columns and the data driver 230. For example, the data lines DL may electrically connect corresponding ones of the sub-pixels included in each of the pixels PX and the data driver 230, respectively.

According to some embodiments, the display panel 100 may further include low power voltage lines, high power voltage lines, sensing lines, and dummy lines. Each of the pixels PX may receive a low power voltage from each of the low power voltage lines. Each of the pixels PX may receive a high power voltage from each of the high power voltage lines. Each of the pixels PX may receive an initialization voltage from each of the sensing lines.

According to some embodiments, a constant voltage may be provided to each of the dummy lines. According to some embodiments, each of the dummy lines may be electrically floating. For example, some of the connection lines CL may not be electrically connected to the gate lines GL depending on pixels PX arrangement or the number of connection lines CL corresponding to a pixel column. In this case, the some of the connection lines CL not electrically connected to the gate lines GL may be used as the dummy lines.

Figure 3:
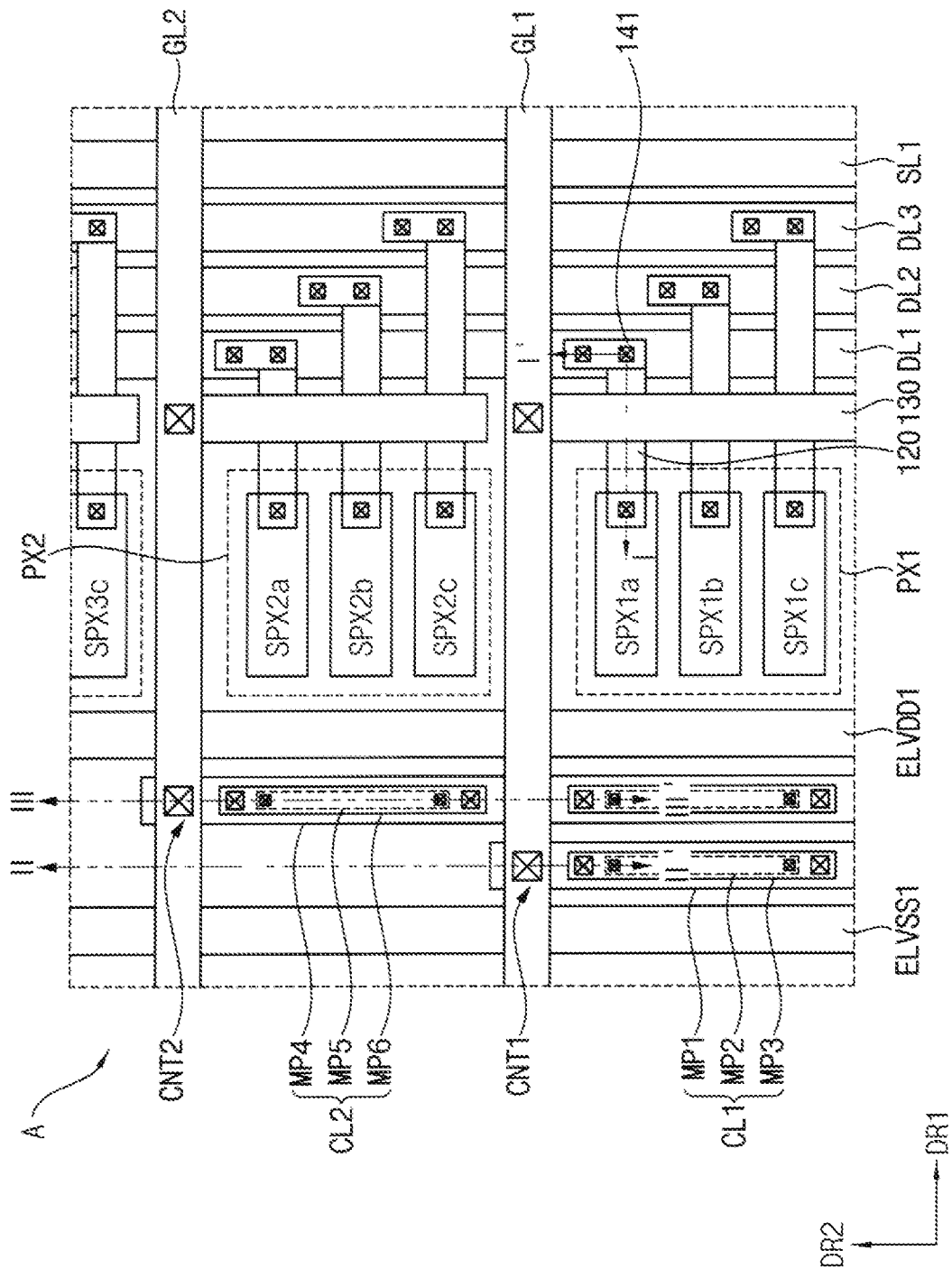
FIG. 3 is an enlarged plan view illustrating an example of an area "A" of FIG. 2 according to some embodiments.
Figure 4:
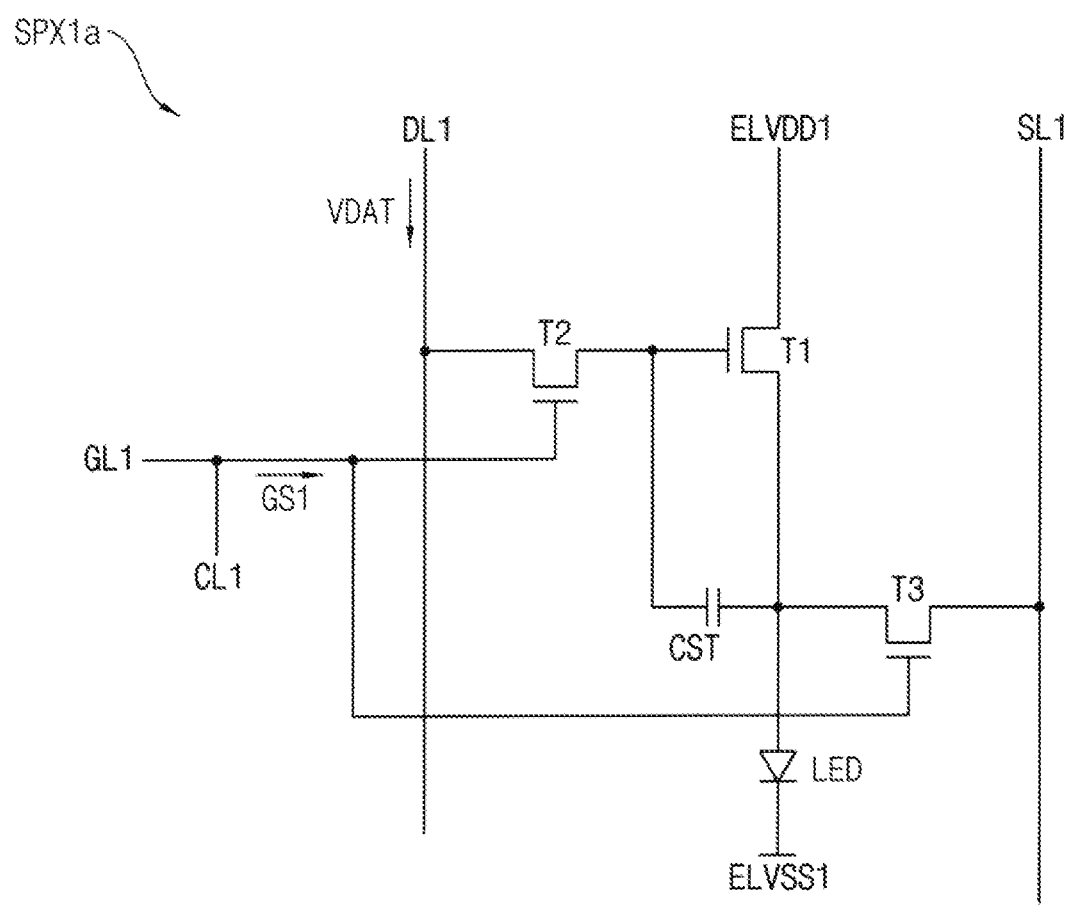
FIG. 4 is a circuit diagram illustrating a first sub-pixel included in the display device of FIG. 3 according to some embodiments.
Figure 5:
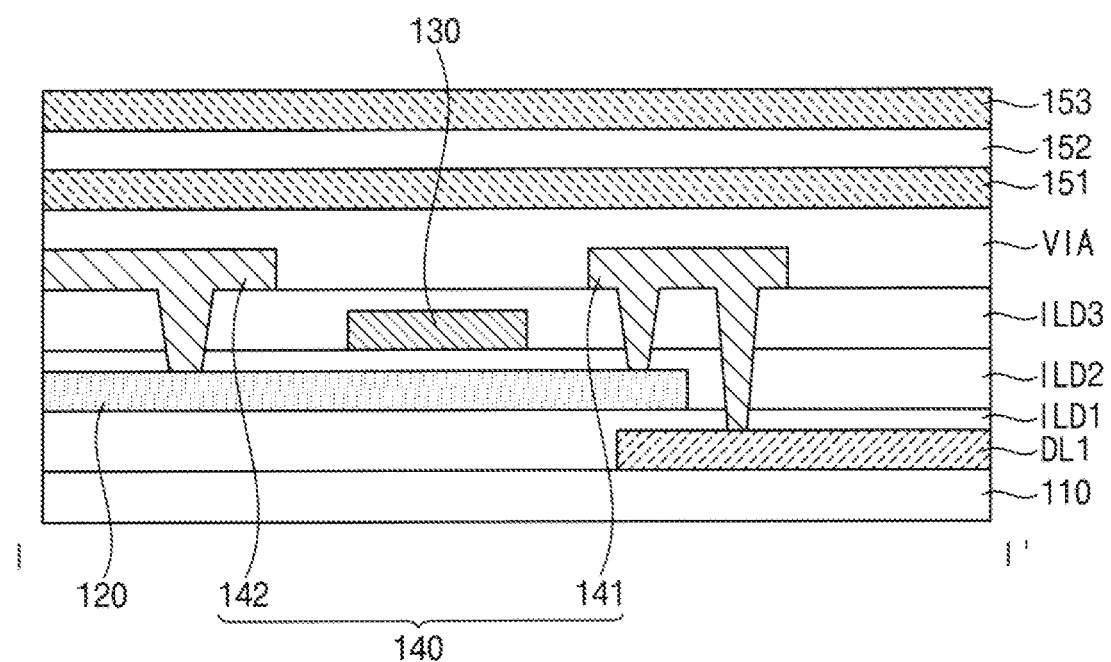
FIG. 5 is a cross-sectional view taken along a line I-I' of FIG. 3 according to some embodiments.
Figure 6:
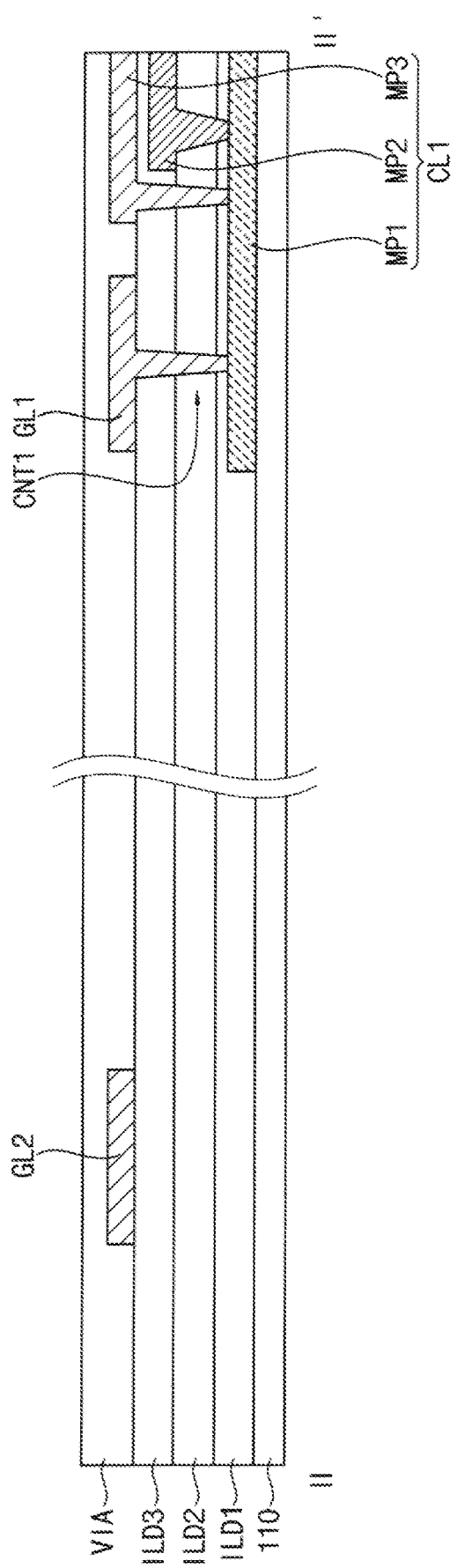
FIG. 6 is a cross-sectional view taken along a line II-II' of FIG. 3 according to some embodiments.
Figure 7:
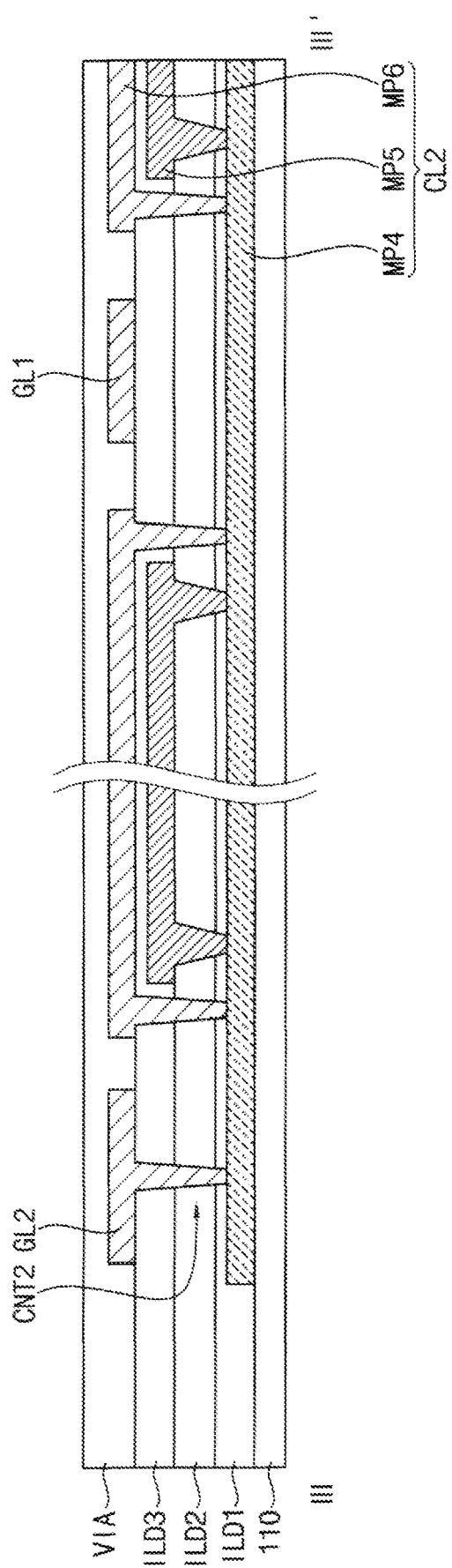
FIG. 7 is a cross-sectional view taken along a line III-III' of FIG. 3 according to some embodiments.

FIG. 3 is an enlarged plan view illustrating an example of an area "A" of FIG. 2. FIG. 4 is a circuit diagram illustrating a first sub-pixel included in the display device of FIG. 3. FIG. 5 is a cross-sectional view taken along a line I-I' of FIG. 3. FIG. 6 is a cross-sectional view taken along a line II-II' of FIG. 3. FIG. 7 is a cross-sectional view taken along a line III-III' of FIG. 3.

Referring to FIGS. 2 to 7, according to some embodiments, a first pixel PX1 may be located in the first pixel row PXr(1) and the first pixel column PXc(1), and a second pixel PX2 may be located in a second pixel row PXr(2) and the first pixel column PXc(1). The first pixel PX1 may include first to third sub-pixels SPX1a, SPX1b, and SPX1c. The second pixel PXL2 may have a substantially same structure as the first pixel PX1, and may be driven in a substantially same driving method.

The first pixel PX1 may be electrically connected to the first gate line GL1. The first gate line GL1 may extend in the first direction DR1. The first connection line CL1 may extend in the second direction DR2. An end of the first connection line CL1 may overlap the first gate line GL1 in a plan view. For example, the end of the first connection line CL1 may be a distal end of the first connection line CL1 in the second direction DR2. The first gate line GL1 may be electrically connected to the first connection line CL1 through a first contact hole CNT1 overlapping the end of the first connection line CL1. For example, another end of the first connection line CL1 may be connected to the gate driver 220. For example, the first pixel PX1 may receive a first gate signal output from the gate driver 220 through the first connection line CL1 and the first gate line GL1. That is, each of the first to third sub-pixels SPX1a, SPX1b, and SPX1c included in the first pixel PX1 may receive the first gate signal.

The second pixel PX2 may be electrically connected to the second gate line GL2. The second gate line GL2 may extend in the first direction DR1, and may be spaced apart from the first gate line GL1 in the second direction DR2. The second connection line CL2 may extend in the second direction DR2, and may be spaced apart from the first connection line CL1 in the first direction DR1. An end of the second connection line CL2 may overlap the second gate line GL2 in a plan view. For example, the end of the second connection line CL2 may be a distal end of the second connection line CL2 in the second direction DR2. The second gate line GL2 may be electrically connected to the second connection line CL2 through a second contact hole CNT2 overlapping the end of the second connection line CL2. For example, another end of the second connection line CL2 may be connected to the gate driver 220. For example, the second pixel PX2 may receive a second gate signal output from the gate driver 220 through the second connection line CL2 and the second gate line GL2. That is, each of the first to third sub-pixels SPX2a, SPX2b, and SPX2c included in the second pixel PX2 may receive the second gate signal.

For example, each of the first and second connection lines CL1 and CL2 may have a stripe shape overall in a plan view. For example, each of the first and second connection lines CL1 and CL2 may be stripe shaped as a whole on the display area of the display panel 100.

The first connection line CL1 and the second gate line GL2 may not be electrically connected to each other. For example, the first connection line CL1 may be spaced apart from the second gate line GL2 in a plan view. That is, the first connection line CL1 extending in the second direction DR2 may have a length that does not overlap the second gate line GL2 in the plan view. For example, a length of the first connection line CL1 in the second direction DR2 may be less than a length of the second connection line CL2 in the second direction DR2.

The second connection line CL2 and the first gate line GL1 may not be electrically connected to each other. For example, the second connection line CL2 may overlap the first gate line GL1 in a plan view. The first gate line GL1 may be located in a different layer from the second connection line CL2. A contact hole may not be formed in a region where the first gate line GL1 and the second connection line CL2 overlap. The first gate line GL1 and the second connection line CL2 may not contact each other. This will be described in more detail later.

According to some embodiments, the first pixel PX1 may be electrically connected to first to third data lines DL1, DL2, and DL3. For example, the first sub-pixel SPX1a may be electrically connected to the first data line DL1, the second sub-pixel SPX1b may be electrically connected to the second data line DL2, and the third sub-pixel SPX1c may be electrically connected to the third data line DL3. Accordingly, each of the first to third sub-pixels SPX1a, SPX1b, and SPX1c may receive different data voltages.

According to some embodiments, each of the first and second pixels PX1 and PX2 may receive a high power voltage ELVDD from a first high power voltage line ELVDD1. Each of the first and second pixels PX1 and PX2 may receive a low power voltage ELVSS from a first low power voltage line ELVSS1. For example, the high power voltage ELVDD may be greater than the low power voltage ELVSS. Each of the first and second pixels PX1 and PX2 may receive an initialization voltage from a first sensing line SL1.

For example, as illustrated in FIG. 3, the first and second connection lines CL1 and CL2 may be located between the first low power voltage line ELVSS1 and the first high power voltage line ELVDD1 in a plan view. The first and second connection lines CL1 and CL2 may be located adjacent to each other. The second connection line CL2 may be located between the first connection line CL1 and the first high power voltage line ELVDD1 in the plan view. The first high power voltage line ELVDD1 may be located between the second connection line CL2 and the first pixel PX1, and between the second connection line CL2 and the second pixel PX2 in the plan view. The first to third data lines DL1, DL2, and DL3 may be located between the first sensing line SL and the first pixel PX1, and between the first sensing line SL and the second pixel PX2. Arrangement of pixels PX and lines on the display panel 100 is not limited to those illustrated in FIG. 3 and may be variously modified.

According to some embodiments, as illustrated in FIG. 4, the first sub-pixel SPX1a included in the first pixel PX may include a first transistor T1, a second transistor T2, a third transistor T3, a storage capacitor CST, and a light emitting diode LED. The light emitting diode LED may include an organic light emitting diode ("OLED") or a nano light emitting diode ("nano-LED"). For example, each of the first to third transistors T1, T2, and T3 may be implemented as an N-type transistor or a P-type transistor. Each of the second and third sub-pixels SPX1*b* and SPX1*c* may have a substantially same structure as the first sub-pixel SPX1*a* and may be driven in a substantially same driving method.

The first transistor T1 may include a control terminal connected to the second transistor T2, a first terminal connected to the first high power voltage line ELVDDL1, and a second terminal connected to the light emitting diode LED. For example, the first transistor T1 may be referred to as a driving transistor.

The second transistor T2 may include a control terminal connected to the first gate line GL1, a first terminal connected to the first data line DL1, and a second terminal connected to the first transistor T1. For example, the second transistor T2 may be referred to as a switching transistor.

The third transistor T3 may include a control terminal connected to the first gate line GL1, a first terminal connected to the light emitting diode LED, and a second terminal connected to the first sensing line SL1. For example, the third transistor T3 may be referred to as a sensing transistor.

The storage capacitor CST may include a first terminal connected to the control terminal of the first transistor T1 and a second terminal connected to the second terminal of the first transistor T1.

The OLED may include a first terminal connected to the first transistor T1 and a second terminal connected to the first low power voltage line ELVSS1. For example, the first terminal may be an anode terminal, and the second terminal may be a cathode terminal. The OLED may include functional layers (e.g. electron/hole injection layers and electron/hole transport layers) and an organic material layer located between the functional layers, and may emit light in a certain wavelength range depending on a material constituting the organic material layer.

The nano-LED may include a first terminal connected to the first transistor T1 and a second terminal connected to the first low power voltage line ELVSS1. For example, the first terminal may be an anode terminal, and the second terminal may be a cathode terminal. The nano-LED may include semiconductor layers (e.g. an N-type semiconductor layer and a P-type semiconductor layer) and an active material layer located between the semiconductor layers. Accordingly, light in a certain wavelength range can be emitted.

According to some embodiments, as illustrated in FIGS. 3 and 5, the display panel 100 may further include a substrate 110, a first insulating layer ILD1, an active pattern 120, a second insulating layer ILD2, a gate electrode 130, a third insulating layer ILD3, a connection electrode 140, a via insulating layer VIA, a first electrode 151, an emission layer 152, and a second electrode 153.

According to some embodiments, the substrate 110 may include a glass substrate, a quartz substrate, a plastic substrate, or the like. For example, the substrate 110 may include the glass substrate. Accordingly, the display device 10 may be a rigid display device. For another example, the substrate 110 may include the plastic substrate. Accordingly, the display device 10 may be a flexible display device. In this case, the substrate 110 may have a structure in which at least one organic film layer and at least one barrier layer are alternately stacked.

The first data line DL1 may be located on the substrate 110. The first data line DL1 may transmit the data voltage to the first sub-pixel SPX1*a*. For example, the first data line DL1 may include a metal, an alloy, a conductive metal oxide, a transparent conductive material, or the like. For example, the first data line DL1 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like.

The first insulating layer ILD1 may cover the first data line DL1 and may be located on the substrate 110. The first insulating layer ILD1 may include an insulating material. For example, the first insulating layer ILD1 may include silicon oxide, silicon nitride, titanium oxide, tantalum oxide, or the like. For example, the first insulating layer ILD1 may be referred to as a lower insulating layer.

The active pattern 120 may be located on the first insulating layer ILD1. For example, the active pattern 120 may include amorphous silicon, polycrystalline silicon, or oxide semiconductor. According to some embodiments, ions may be selectively implanted into the active pattern 120. For example, when the first, second, and third transistors T1, T2, and T3 are the n-type transistors, the active pattern 120 may include a source region and a drain region into which anions are injected, and a channel region into which the anions are not injected.

The second insulating layer ILD2 may cover the active pattern 120 and may be located on the first insulating layer ILD1. The second insulating layer ILD2 may include an insulating material.

The gate electrode 130 may be located on the second insulating layer ILD2. According to some embodiments, the gate electrode 130 may receive the first gate signal through the first gate line GL1. For example, the gate electrode 130 may include a metal, an alloy, a conductive metal oxide, a transparent conductive material, or the like. For example, the gate electrode 130 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like.

The third insulating layer ILD3 may cover the gate electrode 130 and may be located on the second insulating layer ILD2. The third insulating layer ILD3 may include an insulating material. For example, the second insulating layer ILD2 and/or the third insulating layer ILD3 may be referred to as an upper insulating layer.

The connection electrode 140 may be located on the third insulating layer ILD3. For example, the connection electrode 140 may include a metal, an alloy, a conductive metal oxide, a transparent conductive material, or the like. For example, the connection electrode 140 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. According to some embodiments, in order to reduce an electrical resistance of the connection electrode 140, the connection electrode 140 may include Al. For example, the connection electrode 140 may have Ti/Al/Ti structure.

According to some embodiments, the connection electrode 140 may include a source electrode 141 and a drain electrode 142. For example, the source electrode 141 may partially overlap the first data line DL1 and the active pattern 120. The drain electrode 142 may partially overlap the active pattern 120. For example, the source electrode 141 may contact the first data line DL1 through a contact hole formed in the first to third insulating layers ILD1, ILD2, and ILD3. Also, the source electrode 141 may contact the active pattern 120 through a contact hole formed in the second and third insulating layers ILD2 and ILD3. The drain electrode 142 may contact the active pattern 120 through a contact hole formed in the second and third insulating layers ILD2 and ILD3. Each of the source and drain electrodes 141 and 142 may not overlap the gate electrode 130.

According to some embodiments, the source electrode 141 may correspond to the first terminal of the second transistor T2, the drain electrode 142 may correspond to the second terminal of the second transistor T2, and the gate electrode 130 may correspond to the control terminal of the second transistor T2. Accordingly, the active pattern 120, the gate electrode 130, the source electrode 141, and the drain electrode 142 may constitute the second transistor T2.

The via insulating layer VIA may cover the connection electrode 140 and may be located on the third insulating layer ILD3. For example, the via insulating layer VIA may have a substantially flat upper surface. According to some embodiments, the via insulating layer VIA may include an organic insulating material. For example, the via insulating layer VIA may include a photoresist, a polyacrylic resin, a polyimide resin, an acrylic resin, or the like.

The first electrode 151 may be located on the via insulating layer VIA. For example, the first electrode 151 may include a metal, an alloy, a conductive metal oxide, a transparent conductive material, or the like. The emission layer 152 may be located on the first electrode 151. According to some embodiments, a pixel defining layer including an opening exposing an upper surface of the first electrode 151 may be located on the first electrode 151, and the emission layer 152 may be located in the opening. For example, the emission layer 152 may include an organic emission material. The organic light emitting material may emit light by receiving electric current. The second electrode 153 may be located on the emission layer 152. For example, the second electrode 153 may include a metal, an alloy, a conductive metal oxide, a transparent conductive material, or the like. According to some embodiments, the first electrode 151, the emission layer 152, and the second electrode 153 may constitute the light emitting diode LED.

According to some embodiments, as illustrated in FIGS. 3 and 6, the first connection line CL1 may include a lower metal pattern MP1.

For example, the lower metal pattern MP1 may be located between the substrate 110 and the first insulating layer ILD1. That is, the lower metal pattern MP1 may be located between the substrate 110 and the active pattern 120. The lower metal pattern MP1 may be located in a substantially same layer as the first data line DL1. The lower metal pattern MP1 and the first data line DL1 may be substantially simultaneously (or concurrently) formed using a same material. For example, the lower metal pattern MP1 may include a metal, an alloy, a conductive metal oxide, a transparent conductive material, or the like. For example, the lower metal pattern MP1 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like.

According to some embodiments, the lower metal pattern MP1 may extend in the second direction DR1. An end of the lower metal pattern MP1 may overlap the first gate line GL1. The first gate line GL1 may be located on the third insulating layer ILD3. A first contact hole CNT1 may be formed in the first to third insulating layers ILD1, ILD2, and ILD3 in regions where the end of the lower metal pattern MP1 and the first gate line GL1 overlap. The first gate line GL1 may contact the end of the lower metal pattern MP1 through the first contact hole CNT1 exposing the end of the lower metal pattern MP1. For example, the end of the lower metal pattern MP1 may be a distal end of the lower metal pattern MP1 in the second direction DR2, and another end of the lower metal pattern MP1 may be adjacent to the gate driver 220.

For example, the lower metal pattern MP1 may overlap the first gate line GL1 and may be spaced apart from the second gate line GL2 in a plan view. That is, the lower metal pattern MP1 may be spaced apart from the second gate line GL2 in the direction opposite to the second direction DR2. For example, the lower metal pattern MP1 may not be located in a region positioned in the second direction DR2 from the first gate line GL1. Accordingly, the lower metal pattern MP1 may not overlap each of second to (2n)th gate lines spaced apart from the first gate line GL1 in the second direction DR2.

According to some embodiments, the first connection line CL1 may further include an upper metal pattern overlapping the lower metal pattern MP1. The upper metal pattern may include at least one of first or second upper metal patterns MP2 and MP3.

The first upper metal pattern MP2 may be located on the lower metal pattern MP1. The first upper metal pattern MP2 may be arranged between the active pattern 120 and the upper insulating layer. For example, the first upper metal pattern MP2 may be located on the second insulating layer ILD2. The first upper metal pattern MP2 may overlap the lower metal pattern MP1 and may be electrically connected to the lower metal pattern MP1. The first upper metal pattern MP2 may extend in the second direction DR2. For example, the first upper metal pattern MP2 may contact the lower metal pattern MP1 through contact holes formed in the first and second insulating layers ILD1 and ILD2. For example, the first upper metal pattern MP2 may be located in a substantially same layer as the gate electrode 130. The first upper metal pattern MP2 and the gate electrode 130 may be substantially simultaneously (or concurrently) formed using a same material. For example, the first upper metal pattern MP2 may include a metal, an alloy, a conductive metal oxide, a transparent conductive material, or the like.

The second upper metal pattern MP3 may be located on the first upper metal pattern MP2. For example, the second upper metal pattern MP3 may be located on the third insulating layer ILD3. The second upper metal pattern MP3 may overlap the lower metal pattern MP1 and may be electrically connected to the lower metal pattern MP1. The second upper metal pattern MP3 may extend in the second direction DR2. For example, the second upper metal pattern MP3 may contact the lower metal pattern MP1 through contact holes formed in the first to third insulating layers ILD1, ILD2, and ILD3. The second upper metal pattern MP3 may be located in a substantially same layer as each of the first gate line GL1 and the connection electrode 140. The second upper metal pattern MP3, the first gate line GL1, and the connection electrode 140 may be substantially simultaneously (or concurrently) formed using a same material. For example, the second upper metal pattern MP3 may include a metal, an alloy, a conductive metal oxide, a transparent conductive material, or the like.

For example, each of the first and second upper metal patterns MP2 and MP3 may not be formed in a region where the lower metal pattern MP1 and the first gate line GL1 overlap. That is, each of the first and second upper metal patterns MP2 and MP3 may overlap the lower metal pattern MP1 and may be spaced apart from the first gate line GL1 in a plan view. For example, each of the first and second upper metal patterns MP2 and MP3 may be spaced apart from the first gate line GL1 in the direction opposite to the second direction DR2. Optionally, each of the first and second upper metal patterns MP2 and MP3 may be omitted.

Referring to FIGS. 3 and 7, the second connection line CL2 may have a substantially same structure as the first connection line CL1. For example, the second connection line CL2 may include a lower metal pattern MP4, a first upper metal pattern MP5, and a second upper metal pattern MP6. Therefore, repeated descriptions will be omitted.

The lower metal pattern MP4 may be located between the substrate 110 and the first insulating layer ILD1, the first upper metal pattern MP5 may be located on the second insulating layer ILD2, and the second upper metal pattern MP6 may be located on the third insulating layer ILD3.

According to some embodiments, the lower metal pattern MP4 may extend in the second direction DR2 and may overlap each of the first and second gate lines GL1 and GL2. For example, an end of the lower metal pattern MP4 may overlap the second gate line GL2. Another end of the lower metal pattern MP4 may be adjacent to the gate driver 220. A portion of the lower metal pattern MP4 positioned between the end and the other end may overlap the first gate line GL1.

A second contact hole CNT2 may be formed in the first to third insulating layers ILD1, ILD2, and ILD3 in a region where the end of the lower metal pattern MP4 and the second gate line GL2 overlap. The second gate line GL2 may contact the end of the lower metal pattern MP4 through the second contact hole CNT2 exposing the end of the lower metal pattern MP4.

A contact hole may not be formed in the first to third insulating layers ILD1, ILD2, and ILD3 in a region where the lower metal pattern MP4 and the first gate line GL1 overlap. That is, the first gate line GL1 may not be contact the lower metal pattern MP4 and may not be electrically connected to the lower metal pattern MP4.

For example, the lower metal pattern MP4 may overlap each of the first and second gate lines GL1 and GL2 in a plan view, and may be spaced apart from a third gate line. That is, the lower metal pattern MP4 may be spaced apart from the third gate line in the direction opposite to the second direction DR2. For example, the lower metal pattern MP4 may not be located in a region positioned in the second direction DR2 from the second gate line GL2. Accordingly, the lower metal pattern MP4 may not overlap each of third to (2n)th gate lines spaced apart from the second gate line GL2 in the second direction DR2.

For example, each of the first and second upper metal patterns MP5 and MP6 may not be formed in a region where the lower metal pattern MP4 and the first gate line GL1 overlap, and a region where the lower metal pattern MP4 and the second gate line GL2 overlap. That is, each of the first and second upper metal patterns MP5 and MP6 may overlap the lower metal pattern MP4, and may be spaced apart from each of the first and second gate lines GL1 and GL2 in a plan view. In other words, each of the first and second upper metal patterns MP5 and MP6 may be located in a region spaced apart from the first gate line GL1 in the direction opposite to the second direction DR2, and a region between the first gate line GL1 and the second gate line GL2. Optionally, each of the first and second upper metal patterns MP2 and MP3 may be omitted.

According to some embodiments, the connection lines CL may transmit gate signals generated by the gate driver 220 to the gate lines GL. Each of the connection lines CL may include lower and upper metal patterns vertically stacked. Accordingly, an electrical resistance of each of the connection lines CL may be reduced. In addition, an end of a connection line CL may overlap a gate line GL to which the connection line CL is electrically connected. Another end of the connection line CL may be adjacent to the gate driver 220. That is, the connection line CL including upper and lower metal patterns may extend only from the gate driver 220 to the gate line GL to which the connection line CL is electrically connected. Accordingly, a contact failure between the connection lines CL and the gate lines GL crossing each other may be reduced, and a yield of the display device 10 may be improved.

Figure 8:
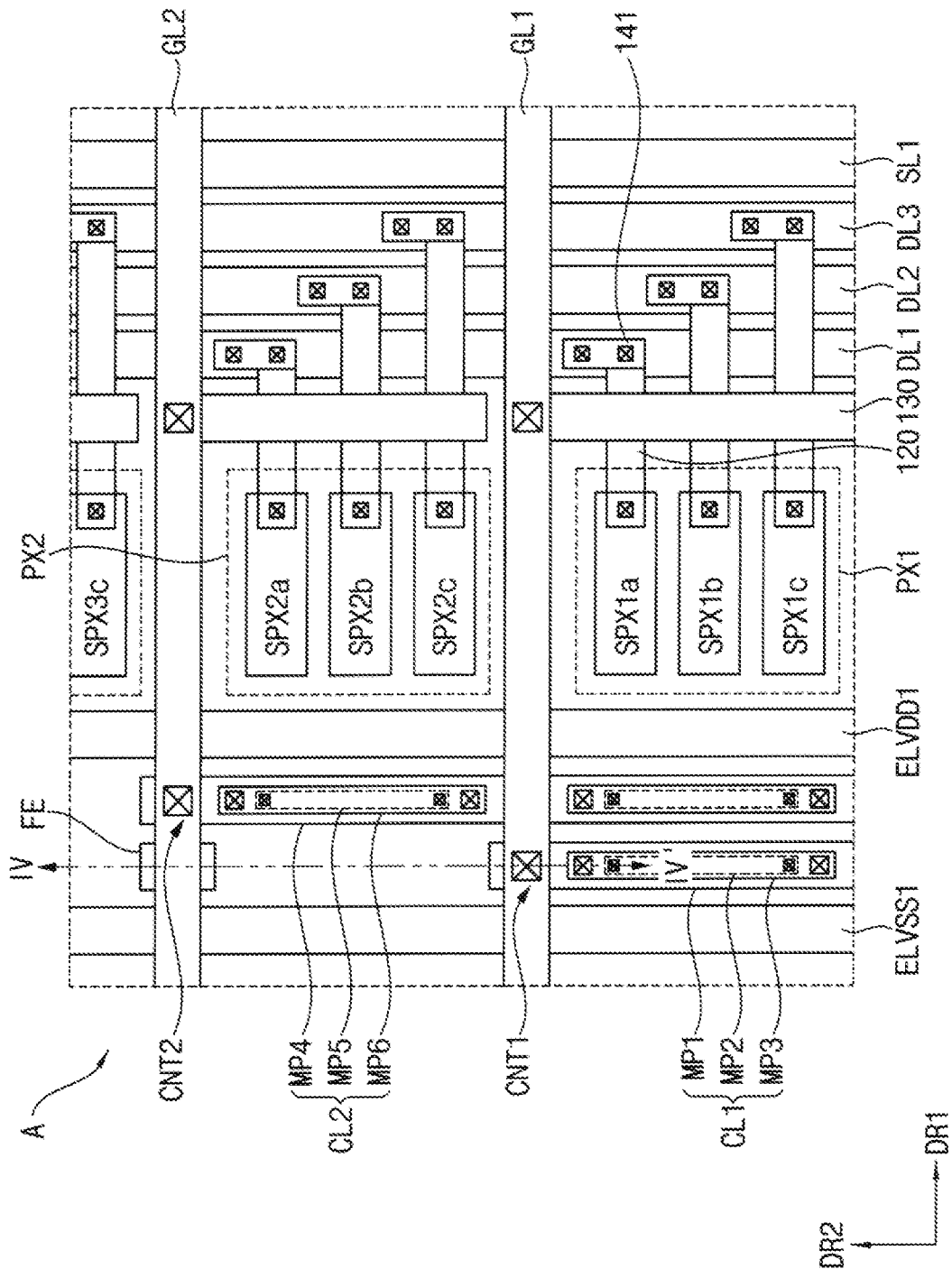
FIG. 8 is an enlarged plan view illustrating another example of the area "A" of FIG. 2 according to some embodiments.
Figure 9:
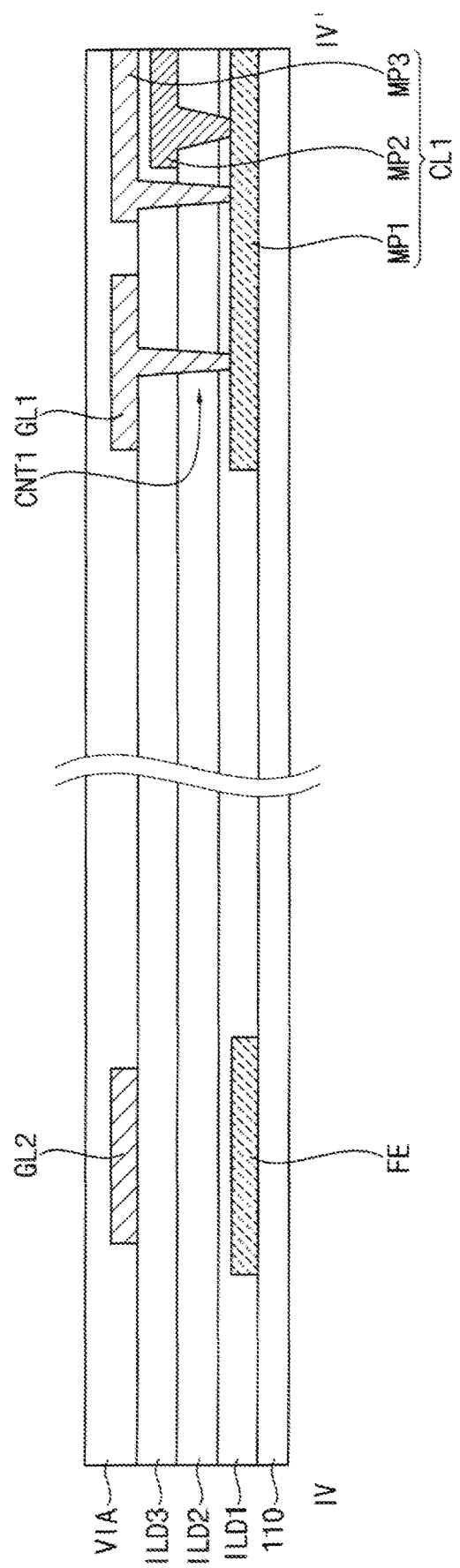
FIG. 9 is a cross-sectional view taken along a line IV-IV' of FIG. 8 according to some embodiments.

FIG. 8 is an enlarged plan view illustrating another example of the area "A" of FIG. 2. FIG. 9 is a cross-sectional view taken along a line IV-IV' of FIG. 8.

Referring to FIGS. 8 and 9, according to some embodiments, the display panel 100 may further include a floating electrode FE.

According to some embodiments, the floating electrode FE may be spaced apart from the first connection line CL1 in the second direction DR2, and may overlap the second gate line GL2 in a plan view. For example, the floating electrode FE may be spaced apart from the end of the first connection line CL1 overlapping the first gate line GL1 in the second direction DR2. That is, the floating electrode FE may be spaced apart from the first gate line GL1 in the second direction DR2.

The floating electrode FE may be spaced apart from the second connection line CL2 in a plan view. For example, the second connection line CL2 may be spaced apart from the floating electrode FE in the first direction DR1.

According to some embodiments, the floating electrode FE may be located between the substrate 110 and the first insulating layer ILD1. That is, the floating electrode FE may be located in a substantially same layer as the lower metal patterns MP1 and MP4. The floating electrode FE and the lower metal patterns MP1 and MP4 may be substantially simultaneously (or concurrently) formed using a same material. For example, the floating electrode FE may include a metal, an alloy, a conductive metal oxide, a transparent conductive material, or the like.

The floating electrode FE may not contact the second gate line GL2. That is, a contact hole may not be formed in the first to third insulating layers ILD1, ILD2, and ILD3 in a region where the floating electrode FE and the second gate line GL2 overlap.

According to some embodiments, the floating electrode FE may be electrically floating. That is, the floating electrode FE may not be electrically connected to each of the first connection line CL1, the second connection line CL2, the first gate line GL1, and the second gate line GL2.

For example, as illustrated in FIG. 7, a contact hole may not be formed in a region where the second connection line CL2 and the first gate line GL1 overlap. Accordingly, a first capacitance may be generated between the lower metal pattern MP4 located on the substrate 110 and the first gate line GL1 located on the third insulating layer ILD3.

For example, as illustrated in FIG. 9, the floating electrode FE may be located under the second gate line GL2, and may overlap the second gate line GL2 in a plan view. Accordingly, a second capacitance may be generated between the floating electrode FE located on the substrate 110 and the second gate line GL2 located on the third insulating layer ILD3. For example, the second capacitance may be a floating capacitance.

According to some embodiments, as the second capacitance is generated, a difference between a capacitance (eg. the first capacitance) generating in a region where the second connection line CL2 and the first gate line GL1 overlap and a capacitance (eg. the second capacitance) generating in a region where the floating electrode FE and the second gate line GL2 overlap may be reduced. Accordingly, a display quality of the display device 10 may be improved.

According to some embodiments, the floating electrode FE may be spaced apart from the end of a connection line CL in the second direction DR2, and may overlap each of a plurality of gate lines GL not overlapping the connection line CL. For example, a first imaginary line overlapping the first connection line CL1 and extending the second direction DR2 may be defined. Floating electrodes FE may be formed in regions where the first imaginary line and second to (2n)th gate lines overlap. A second imaginary line overlapping the second connection line CL2 and extending the second direction DR2 may be defined. Floating electrodes FE may be formed in regions where the second imaginary line and third to (2n)th gate lines overlap.

Figure 10:
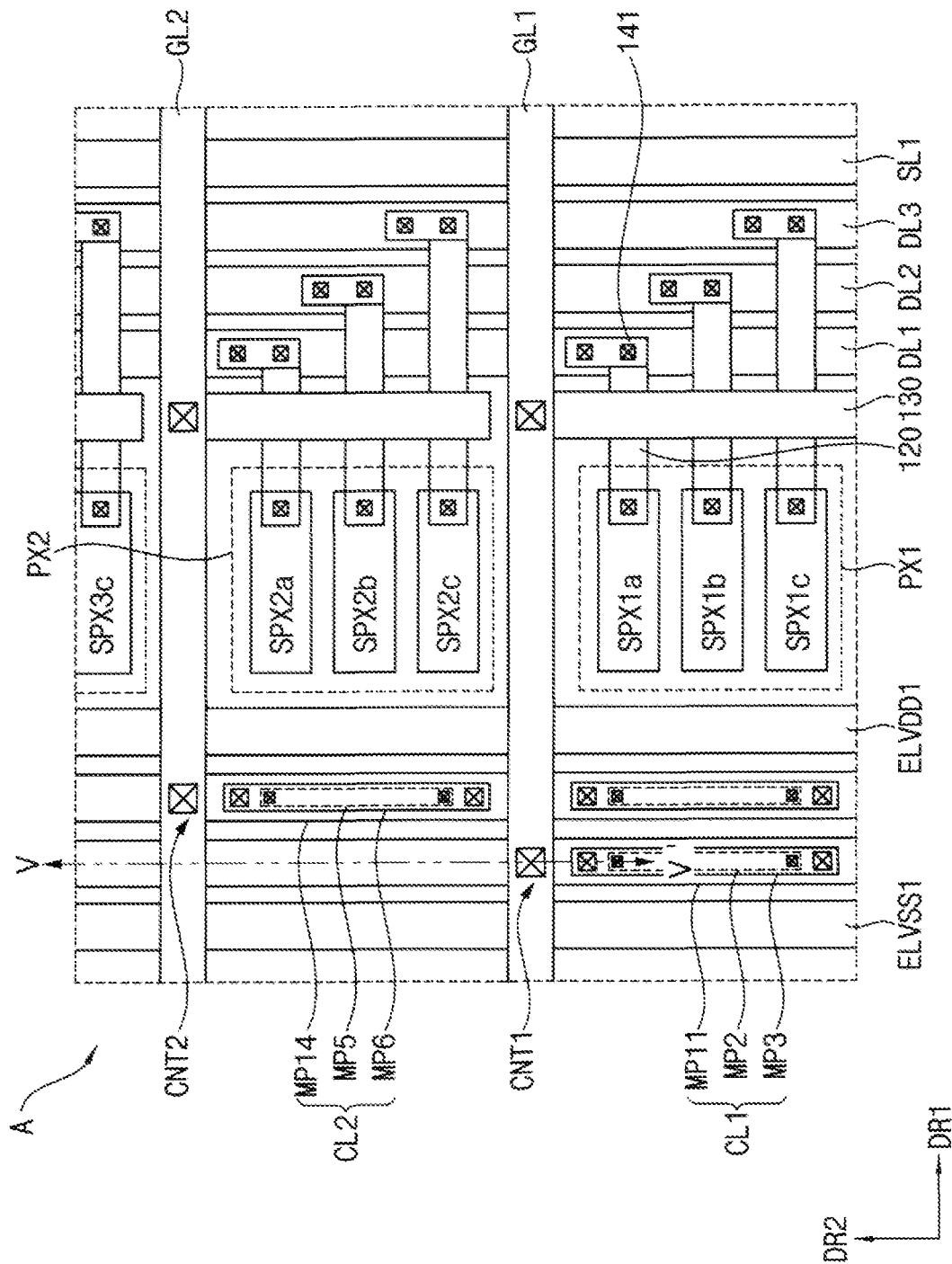
FIG. 10 is an enlarged plan view illustrating still another example of the area "A" of FIG. 2 according to some embodiments.
Figure 11:
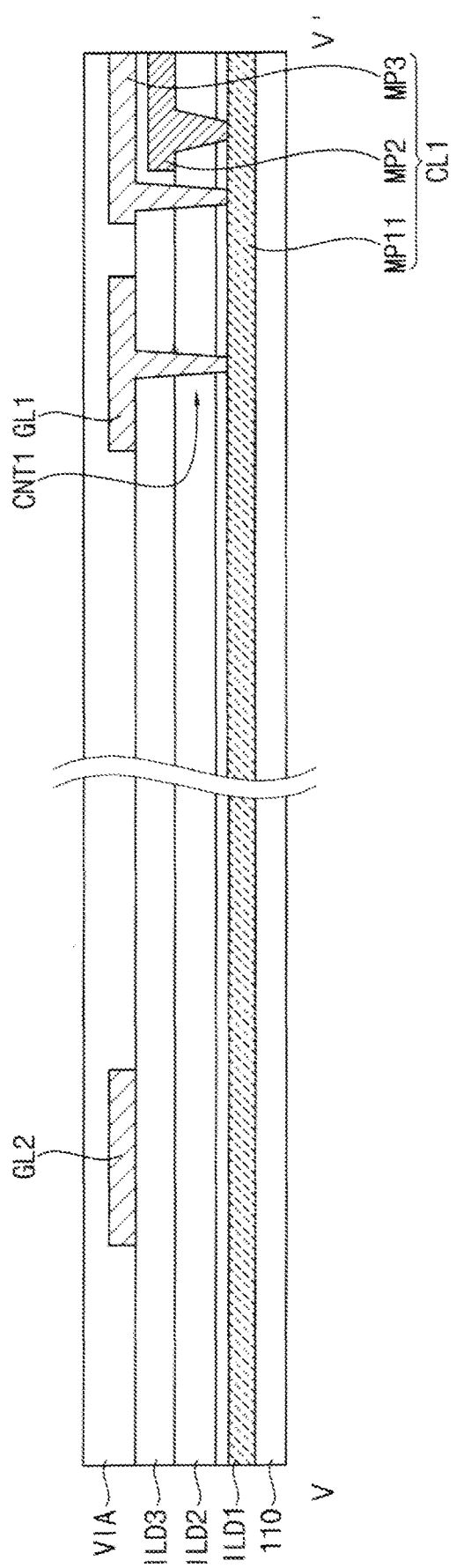
FIG. 11 is a cross-sectional view taken along a line V-V of FIG. 10 according to some embodiments.

FIG. 10 is an enlarged plan view illustrating still another example of the area "A" of FIG. 2. FIG. 11 is a cross-sectional view taken along a line V-V of FIG. 10.

A display device according to embodiments described with reference to FIGS. 10 and 11 may be the substantially same as or similar to the display device described with reference to FIGS. 2 to 7 except for the lower metal patterns MP11 and MP14. Therefore, repeated descriptions will be omitted.

According to some embodiments, a lower metal pattern MP11 included in the first connection line CL1 may extend in the second direction DR2, and may overlap each of the first and second gate lines GL1 and GL2. A lower metal pattern MP14 included in the second connection line CL2 may extend in the second direction DR2, and may overlap each of the first and second gate lines GL1 and GL2.

For example, the lower metal pattern MP11 included in the first connection line CL1 may include a first portion overlapping the first gate line GL1 in a plan view, a second portion positioned in the second direction DR2 from the first portion, and a third portion opposite to the second portion. The third portion of the lower metal pattern MP11 may be positioned in the direction opposite to the second direction DR2 from the first portion.

For example, the lower metal pattern MP11 may be integrally formed. That is, the first to third portions of the lower metal pattern MP11 may not be physically separated from each other.

The first gate line GL1 may contact the first portion of the lower metal pattern MP11. For example, a first contact hole CNT1 may be formed in the first to third insulating layers ILD1, ILD2, and ILD3 in a region where the first portion of the lower metal pattern MP11 and the first gate line GL1 overlap. The first gate line GL1 may contact the first portion of the lower metal pattern MP11 through the first contact hole CNT1 exposing the first portion of the lower metal pattern MP11.

The second gate line GL2 may overlap the second portion of the lower metal pattern MP11 in a plan view. The second gate line GL2 may not contact the second portion of the lower metal pattern MP11. For example, a contact hole may not be formed in the first to third insulating layers ILD1, ILD2, and ILD3 in a region where the second portion of the lower metal pattern MP11 and the second gate line GL2 overlap.

The upper metal patterns MP2 and MP3 included in the first connection line CL1 may be spaced apart from each of the first and second portions of the lower metal pattern MP11 in a plan view. That is, the upper metal patterns MP2 and MP3 may not overlap each of the first and second portions of the lower metal pattern MP11 in the plan view. The upper metal patterns MP2 and MP3 may overlap the third portion of the lower metal pattern MP11 in the plan view. That is, the upper metal patterns MP2 and MP3 may be spaced apart from the first portion of the lower metal pattern MP11 in the direction opposite to the second direction DR2.

For example, the lower metal pattern MP14 included in the second connection line CL2 may include a first portion overlapping the second gate line GL2 in a plan view, a second portion positioned in the second direction DR2 from the first portion, and a third portion opposite to the second portion. The third portion of the lower metal pattern MP14 may be positioned in the direction opposite to the second direction DR2 from the first portion.

For example, the lower metal pattern MP14 may be integrally formed. That is, the first to third portions of the lower metal pattern MP14 may not be physically separated from each other.

The second gate line GL2 may contact the first portion of the lower metal pattern MP14. For example, a second contact hole CNT2 may be formed in the first to third insulating layers ILD1, ILD2, and ILD3 in a region where the first portion of the lower metal pattern MP14 and the second gate line GL2 overlap. The second gate line GL2 may contact the first portion of the lower metal pattern MP14 through the second contact hole CNT2 exposing the first portion of the lower metal pattern MP14.

The first gate line GL1 may overlap the third portion of the lower metal pattern MP14 in a plan view. The first gate line GL1 may not contact the third portion of the lower metal pattern MP14. For example, a contact hole may not be formed in the first to third insulating layers ILD1, ILD2, and ILD3 in a region where the third portion of the lower metal pattern MP14 and the first gate line GL1 overlap.

The upper metal patterns MP5 and MP6 included in the second connection line CL2 may be spaced apart from each of the first and second portions of the lower metal pattern MP14 in a plan view. That is, the upper metal patterns MP5 and MP6 may not overlap each of the first and second portions of the lower metal pattern MP14 in the plan view. The upper metal patterns MP5 and MP5 may overlap the third portion of the lower metal pattern MP14 in the plan view. That is, the upper metal patterns MP5 and MP6 may be spaced apart from the first portion of the lower metal pattern MP14 in the direction opposite to the second direction DR2.

For example, as illustrated in FIG. 11, the lower metal pattern MP11 included in the first connection line CL1 may be located under the second gate GL2, and may overlap the second gate line GL2. Accordingly, a third capacitance may be generated between the lower metal pattern MP11 located on the substrate 110 and the second gate line GL2 located on the third insulating layer ILD3. For example, the lower metal pattern MP11 may be electrically connected to the gate driver 220, and the third capacitance may be greater than the second capacitance.

For example, as described above, the first capacitance may be generated between the lower metal pattern MP4 located on the substrate 110 and the first gate line GL1 located on the third insulating layer ILD3 in a region where the second connection line CL2 and the first gate line GL1 overlap. According to some embodiments, as the third capacitance is generated, a difference between a capacitance (eg. the first capacitance) generating in a region where the second connection line CL2 and the first gate line GL1 overlap and a capacitance (eg. the third capacitance) generating in a region where the first connection line CL1 and the second gate line GL2 overlap may be reduced. Accordingly, a display quality of the display device 10 may be improved.

According to some embodiments, a lower metal pattern included in a connection line CL may extend in the second direction DR2 and may overlap first to (2n)th gate lines. That is, the lower metal pattern may extend in the second direction DR2 so as to cross the entire display panel. In contrast, an upper metal pattern included in the connection line CL may extend only from a side of the display panel to a gate line to which the connection line CL is electrically connected. Accordingly, a region in which metal patterns are vertically stacked may be reduced, and a contact failure between the metal patterns may be reduced.

Although aspects of certain embodiments and implementations have been described herein, other embodiments and modifications will be apparent from this description. Accordingly, the inventive concepts are not limited to such embodiments, and is defined by the broader scope of the appended claims and their equivalents, and various obvious modifications and equivalent arrangements as would be apparent to a person of ordinary skill in the art.

What is claimed is:

1. A display panel comprising:
   a first gate line extending in a first direction;
   a second gate line extending in the first direction and spaced apart from the first gate line in a second direction crossing the first direction;
   a first connection line extending in the second direction; and
   a second connection line extending in the second direction and spaced apart from the first connection line in the first direction,
   wherein a distal end of the first connection line overlaps the first gate line and is electrically connected to the first gate line,
   wherein a proximal end of the first connection line is connected to a gate driver,
   wherein a first connection is formed between the proximal end of the first connection line and the gate driver without passing through the distal end of the first connection line,
   wherein a distal end of the second connection line overlaps the second gate line and is electrically connected to the second gate line,
   wherein a proximal end of the second connection line is connected to the gate driver, and
   wherein a second connection is formed between the proximal end of the second connection line and the gate driver without passing through the distal end of the second connection line.

2. The display panel of claim 1, wherein the first connection line is spaced apart from the second gate line in a plan view.

3. The display panel of claim 2, wherein the second connection line overlaps the first gate line in the plan view.

4. The display panel of claim 1, wherein a length of the first connection line in the second direction is less than a length of the second connection line in the second direction.

5. The display panel of claim 1, further comprising:
   a first pixel in a first pixel column and a first pixel row, and electrically connected to the first gate line; and
   a second pixel in the first pixel column and a second pixel row spaced apart from the first pixel row in the second direction, and electrically connected to the second gate line, and
   wherein the first and second connection lines are adjacent to each other.

6. The display panel of claim 1, further comprising:
   a substrate;
   a first insulating layer on the substrate;
   an active pattern on the first insulating layer;
   a second insulating layer covering the active pattern;
   a gate electrode on the second insulating layer; and
   a third insulating layer covering the gate electrode, and
   wherein the first gate line is on the third insulating layer.

7. The display panel of claim 6, wherein the first connection line includes a lower metal pattern between the substrate and the first insulating layer, extending in the second direction, and electrically connected to the first gate line.

8. The display panel of claim 7, wherein a distal end of the lower metal pattern overlapping the first gate line and in contact with the first gate line.

9. The display panel of claim 7, wherein the first connection line further includes a first upper metal pattern on the lower metal pattern, overlapping the lower metal pattern, and electrically connected to the lower metal pattern.

10. The display panel of claim 9, wherein the first connection line further includes a second upper metal pattern on the first upper metal pattern, overlapping the lower metal pattern, and electrically connected to the lower metal pattern.

11. The display panel of claim 10, wherein the first upper metal pattern is in a same layer as the gate electrode, and
    wherein the second upper metal pattern is in a same layer as the first gate line.

12. The display panel of claim 1, further comprising a floating electrode spaced apart from the distal end of the first connection line in the second direction and overlapping the second gate line in a plan view.

13. The display panel of claim 12, wherein the floating electrode does not contact the second gate line.

14. The display panel of claim 12, wherein the floating electrode is spaced apart from the second connection line in the plan view.

15. A display panel comprising:
    a substrate;
    a lower insulating layer on the substrate;
    an active pattern on the lower insulating layer;
    an upper insulating layer covering the active pattern;
    a plurality of gate lines on the upper insulating layer, extending in a first direction, and spaced apart from each other in a second direction crossing the first direction; and
    a plurality of connection lines between the substrate and the lower insulating layer, extending in the second direction, and spaced apart from each other in the first direction,
    wherein a distal end of a first connection line is electrically connected to a first gate line, and is spaced apart from a second gate line in a plan view,
    wherein a proximal end of the first connection line is connected to a gate driver,
    wherein a first connection is formed between the proximal end of the first connection line and the gate driver without passing through the distal end of the first connection line,
    wherein a distal end of a second connection line is electrically connected to the second gate line, and overlaps the first and second gate lines in the plan view,
    wherein a proximal end of the second connection line is connected to the gate driver, and wherein a second connection is formed between the proximal end of the second connection line and the gate driver without the passing through the distal end of the second connection line.

16. The display panel of claim 15, wherein a distal end of the first connection line overlaps the first gate line in the plan view, and wherein a distal end of the second connection line overlaps the second gate line in the plan view.

17. The display panel of claim 15, further comprising a floating electrode in a same layer as the first connection line, spaced apart from the first connection line, and overlapping the second gate line in the plan view.

18. The display panel of claim 17, wherein the floating electrode does not contact the second gate line.

19. The display panel of claim 17, wherein the floating electrode is spaced apart from the second connection line in the plan view.

* * * * *